(12) United States Patent
Liu et al.

(10) Patent No.: US 9,779,831 B1
(45) Date of Patent: Oct. 3, 2017

(54) ELECTRONIC APPARATUS AND DATA VERIFICATION METHOD USING THE SAME

(71) Applicant: Wistron Corporation, New Taipei (TW)

(72) Inventors: Jeng-Shiun Liu, New Taipei (TW); Chun-Chih Lin, New Taipei (TW); Tung-Lin Lu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/196,045

(22) Filed: Jun. 29, 2016

(30) Foreign Application Priority Data

Mar. 30, 2016 (TW) .............................. 105110044 A

(51) Int. Cl.
*G11C 16/08* (2006.01)
*G11C 16/34* (2006.01)
*G11C 16/26* (2006.01)

(52) U.S. Cl.
CPC .......... *G11C 16/3459* (2013.01); *G11C 16/26* (2013.01)

(58) Field of Classification Search
CPC . G11C 16/3454; G11C 16/10; G11C 16/3481; G11C 2216/22; G11C 7/1042; G11C 11/5628; G11C 16/04; G11C 16/3459; G11C 16/0483; G11C 16/08; G11C 16/28; G11C 16/26
See application file for complete search history.

(56) References Cited

U.S. PATENT DOCUMENTS

| 2010/0070260 | A1* | 3/2010 | Mori ................... G06F 17/5022 703/28 |
| 2012/0072806 | A1* | 3/2012 | Tabata ................ G06F 11/1048 714/773 |
| 2015/0370727 | A1* | 12/2015 | Hashimoto ......... G06F 12/1416 711/163 |
| 2016/0266965 | A1* | 9/2016 | B ........................ G06F 11/1068 |

* cited by examiner

*Primary Examiner* — Hien Nguyen
(74) *Attorney, Agent, or Firm* — Jianq Chyun IP Office

(57) ABSTRACT

An electronic apparatus and a data verification method using the same are provided. The electronic apparatus includes a first read-only memory having first data, a second read-only memory having second data and a controller. A correspondence relation exists between the first data and the second data. The controller is coupled to the first read-only memory and the second read-only memory. The controller reads first sub-data of the first data from the first read-only memory, and reads second sub-data of the second data corresponding to the first sub-data from the second read-only memory according to the correspondence relation. The first sub-data includes to-be-verified data. The controller perfoi ins a verification operation to the to-be-verified data according to the first sub-data, the second sub-data and the correspondence relation.

13 Claims, 5 Drawing Sheets

ELECTRONIC APPARATUS AND DATA VERIFICATION METHOD USING THE SAME

CROSS-REFERENCE TO RELATED APPLICATION

This application claims the priority benefit of Taiwan application serial no. 105110044, filed on Mar. 30, 2016. The entirety of the above-mentioned patent application is hereby incorporated by reference herein and made a part of this specification.

BACKGROUND OF THE INVENTION

1. Field of the Invention

The invention relates to an electronic apparatus and a data verification method using the same, and more particularly, relates to an electronic apparatus having at least two read-only memories and a data verification method using the same.

2. Description of Related Art

Read-Only Memory (ROM) is a semiconductor memory characterized in that, data can no longer be changed or deleted once being stored into the ROM, and content therein does not disappear due to power-off. Therefore, ROM is usually used to store programs or data that do not require frequent changes, such as Basic Input Output System (BIOS) of computer systems and firmware of various microcomputer systems.

A typical usage of ROM is to record Vital Product Data (VPD). VPD includes important information of hardware or software, such as part numbers and serial numbers. In general, ROM uses byte as the minimal access unit. When VPD is to be written into ROM, VPD is often systematically grouped into multiple groups, and the last byte of each group is defined as a checksum byte. Accordingly, when a partial content of VPD is to be read, in order to verify correctness of the read data, aside from the desired partial content, all data in the group where the partial content is located must also be read so that a zero-checksum verification may be performed to the group of data. As a result, a massive amount of unnecessary bytes may be read during the process of verifying correctness of the data, resulting in reduction of data verification efficiency.

SUMMARY OF THE INVENTION

The invention is directed to an electronic apparatus and a data verification method using the same, which are capable of reducing a number of times for a read operation is performed to ROM in the electronic apparatus during a data verification, so as to improve the data verification efficiency.

The electronic apparatus of the invention includes a first read-only memory having first data, a second read-only memory having second data and a controller. A correspondence relation exists between the first data and the second data. The controller is coupled to the first read-only memory and the second read-only memory. The controller reads first sub-data of the first data from the first read-only memory, and reads second sub-data of the second data corresponding to the first sub-data from the second read-only memory according to the correspondence relation. To-be-verified data is included in the first data. The controller performs a verification operation to the to-be-verified data according to the first sub-data, the second sub-data and the correspondence relation.

The data verification method of the invention is adapted to verify to-be-verified data. The data verification method includes the following steps. A first read-only memory and a second read-only memory are configured. The first read-only memory has first data, the second read-only memory has second data, and a correspondence relation exists between the first data and the second data. First sub-data of the first data is read from the first read-only memory, and second sub-data of the second data corresponding to the first sub-data is read from the second read-only memory according to the correspondence relation. The to-be-verified data is included in the first data. A verification operation is performed to the to-be-verified data according to the first sub-data, the second sub-data and the correspondence relation.

Based on the above, the second read-only memory is configured in the electronic apparatus in addition to the first read-only memory according to the embodiments of the invention, and the correspondence relation exists between the second data of the second read-only memory and the first data of the first read-only memory. As such, while verifying the to-be-verified data in the first data, the to-be-verified data may be verified by using the second read-only memory and said correspondence relation at the same time in addition to the first read-only memory where the to-be-verified data is located. Accordingly, the number of times for the read operation is performed during the data verification may be reduced to improve the data verification efficiency.

To make the above features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
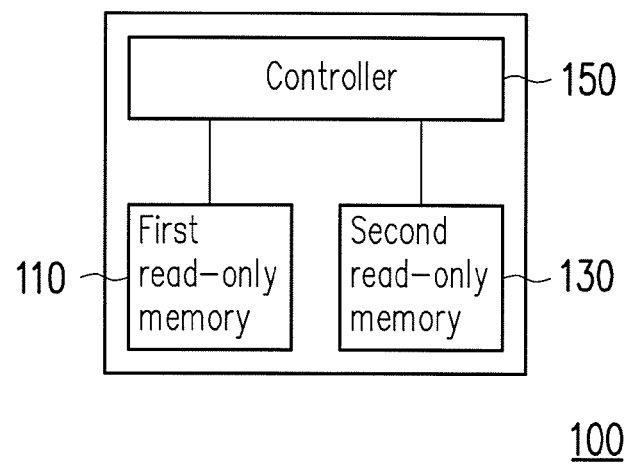
FIG. 1 is a block diagram illustrating an electronic apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram illustrating an electronic apparatus according to an embodiment of the invention. Referring to FIG. 1, an electronic apparatus 100 includes a first read-only memory 110, a second read-only memory 130 and a controller 150. In an embodiment of the invention, the first read-only memory 110 and the second read-only memory 130 belong to an Electrically Erasable Programmable ROM (EEPROM) and use byte as the minimal access unit, but the invention is not limited thereto. In other embodiments, the first read-only memory 110 and the second read-only memory 130 may also be, for example, a Programmable ROM (PROM), a flash memory, or other types of read-only memory. The controller 150 is coupled to the first read-only memory 110 and the second read-only memory 130, and is configured to execute a plurality of logic gates or control commands implemented in form of hardware or firmware and operate the first read-only memory 110 and the second read-only memory 130 according to the received commands (e.g., read, write or erase commands). In the present embodiment, the controller 150 is, for example, a memory controller. The controller 150 includes a control circuit, and is configured to control a data access operation of the first read-only memory 110 and the second read-only memory 130.

Figure 2:
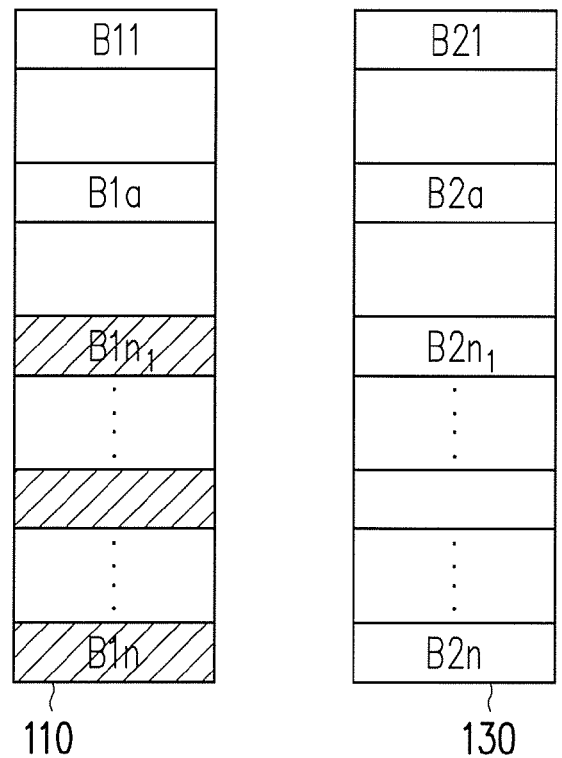
FIG. 2 is a schematic diagram illustrating a data verification method according to an embodiment of the invention.
Figure 3:
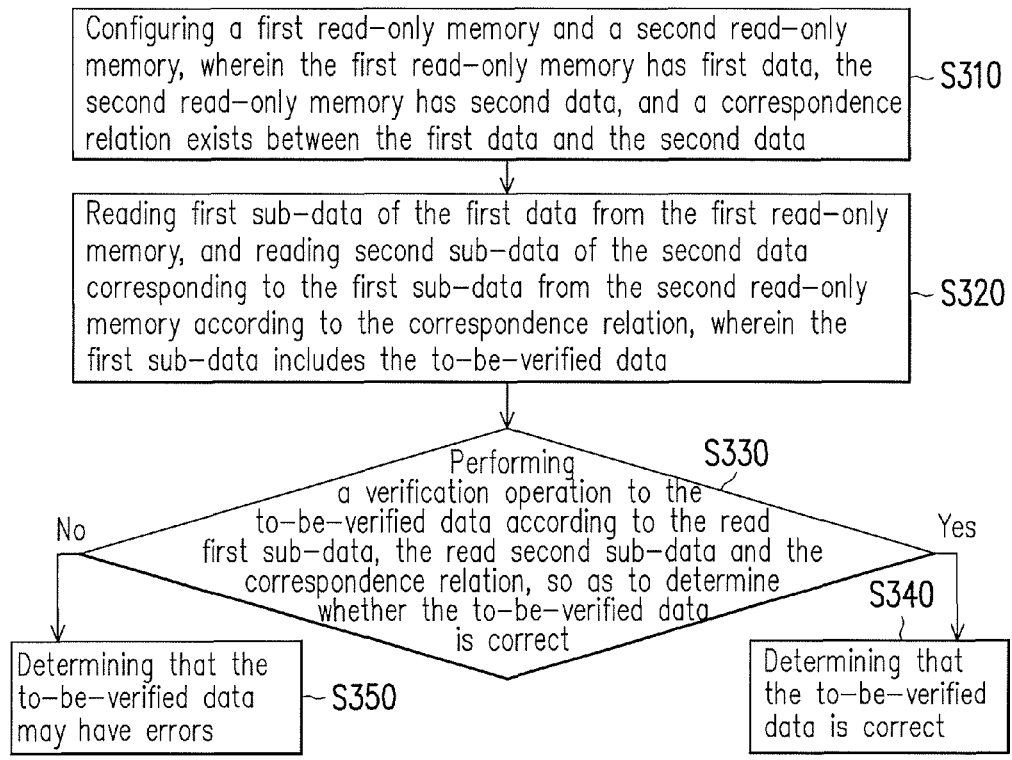
FIG. 3 is a flowchart illustrating a data verification method according to an embodiment of the invention.

FIG. 2 is a schematic diagram illustrating a data verification method according to an embodiment of the invention. FIG. 3 is a flowchart illustrating a data verification method according to an embodiment of the invention. The method of the present embodiment is adapted to the electronic apparatus 100 in FIG. 1. Detailed steps in the method of the present embodiment are described below with reference to each component of the electronic apparatus 100 in FIG. 1.

Referring to FIG. 2 and FIG. 3, in step S310, the controller 150 configures the first read-only memory 110 having first data and the second read-only memory 130 having second data, wherein a correspondence relation exists between the first data and the second data. As shown in FIG. 2, the first read-only memory has the first data. The first data includes n bytes B11 to B1n and is divided into r data groups. Each of the data groups includes $n_i$ bytes. Herein, i is a positive integer ranges from 1 to r, and $n=n_1+n_2+\ldots+n_r$. One byte in each of the data groups is defined as a checksum byte. More specifically, the checksum byte in the data group is defined to adjust a sum of the bytes in the data group to be zero byte. Zero byte means that each bit in the byte is zero. In the present embodiment, the last byte in each of the data groups is defined as the checksum byte (which is denoted by slash lines in the drawing). For instance, in the case where no error occurs in the data, the checksum byte $B1n_1$ is defined to make a sum of the byte B11 to the byte $B1n_1$ to be zero byte.

The second read-only memory 130 has the second data, and a correspondence relation exists between the first data and the second data. In the present embodiment, the second data serves as a backup of the first data in mirror manner. Specifically, the second data includes n bytes B21 to B2n, wherein content of the byte B21 is identical to content of the byte B11, content of the byte B22 is identical to content of the byte B12, and the rest may be deduced by analogy. In other words, in the case where no error occurs in the data, the second data is identical to the first data. For instance, the first read-only memory 110 and the second read-only memory 130 provided by the embodiments of the invention may be implemented by, for example, two Electrically Erasable Programmable ROMs, each of which is the backup to each other and compliant with a Storage Bridge Bay (SBB) standard.

At this point, the configuration of the first read-only memory 110 and the second read-only memory 130 is completed by the controller 150. Herein, it is assumed that to-be-verified data is included in the first data. Accordingly, in step S320, the controller 150 reads first sub-data including the to-be-verified data of the first data from the first read-only memory 110, and reads second sub-data of the second data corresponding to the first sub-data from the second read-only memory 130 according to the correspondence relation between the first data and the second data. Specifically, in the present embodiment, the controller 150 may receive, for example, a read command from a host system, and the read command is used to instruct reading, for example, to-be-verified data B1a of one byte from the first read-only memory 110, but the invention is not limited thereto. After the read command is received, the controller 150 reads the first sub-data including the to-be-verified data B1a of the first data from the first read-only memory 110. In the present embodiment, the first sub-data is the to-be-verified data B1a. Also, the controller 150 reads second sub-data B2a of the second data corresponding to the first sub-data (i.e., the to-be-verified data B1a) from the second read-only memory 130.

Next, in step S330, the controller 150 performs a verification operation to the to-be-verified data according to the read first sub-data, the read second sub-data and the correspondence relation between the first data and the second data, so as to determine whether the to-be-verified data is correct. Specifically, in the present embodiment, because the second data serves as the backup of the first data in mirror manner, each bit in the first sub-data B1a should be identical to the corresponding bit in the second sub-data B2a if the to-be-verified data B1a is correct. Therefore, the controller 150 may perform the verification operation to the to-be-verified data B1a by, for example, performing an XOR (Exclusive-OR) operation to the first sub-data B1a and the second sub-data B2a. If a result of the XOR operation is zero byte, it means that each bit in the first sub-data B1a is identical to the corresponding bit in the second sub-data B2a. In this case, in step S340, the controller 150 determines that the to-be-verified data B1a is correct, so that the to-be-verified data B1a determined as being correct may be used in response to the read command. Conversely, if the result of the XOR operation is not zero byte but includes at least one bit value being 1, in step S350, the controller 150 determines that the to-be-verified data B1a corresponding to the bit value being 1 may have errors, so that the to-be-verified data B1a possibly having errors is not used in response to the read command. For instance, if bit values of the first bit and the third bit in the result of the XOR operation are 1 while other bit values being 0, the controller 150 determines that the first bit and the third bit of the to-be-verified data B1a may have errors.

In some embodiments of the invention, after the controller 150 determines that the to-be-verified data may have errors, for example, the controller 150 may further restore the to-be-verified data according to the result of the verification operation, and use the restored to-be-verified data in response to the read command. For instance, in the foregoing embodiment, the controller 150 may reverse content of each of the first bit and the third bit in the to-be-verified data B1a in order to obtain the restored to-be-verified data, and then use the restored to-be-verified data in response to the read command.

In the method of the foregoing embodiment, the to-be-verified data may be verified by reading the first sub-data and the second sub-data without reading the entire data group including the to-be-verified data, such that a read count required during the verification may be reduced to improve the data verification efficiency.

The to-be-verified data in the foregoing embodiment is data of one byte in the first read-only memory 110, but the invention is not limited thereto. Various embodiments are provided below and served to describe that the to-be-verified data may also be data including a plurality of bytes.

Figure 4:
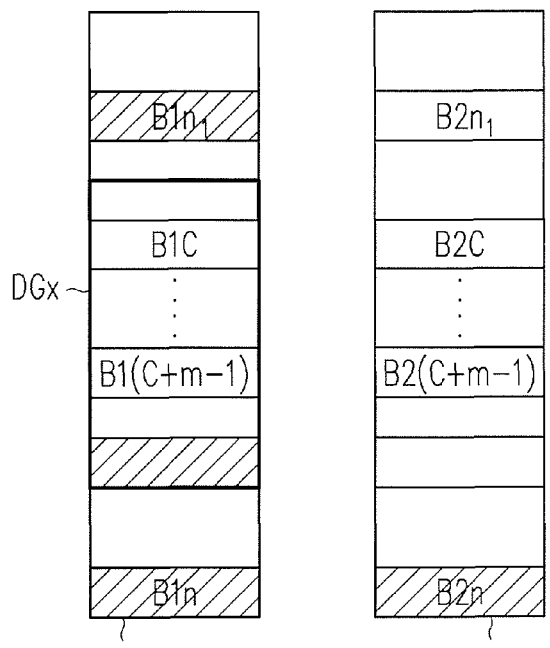
FIG. 4 is a schematic diagram illustrating a data verification method according to an embodiment of the invention.
Figure 5:
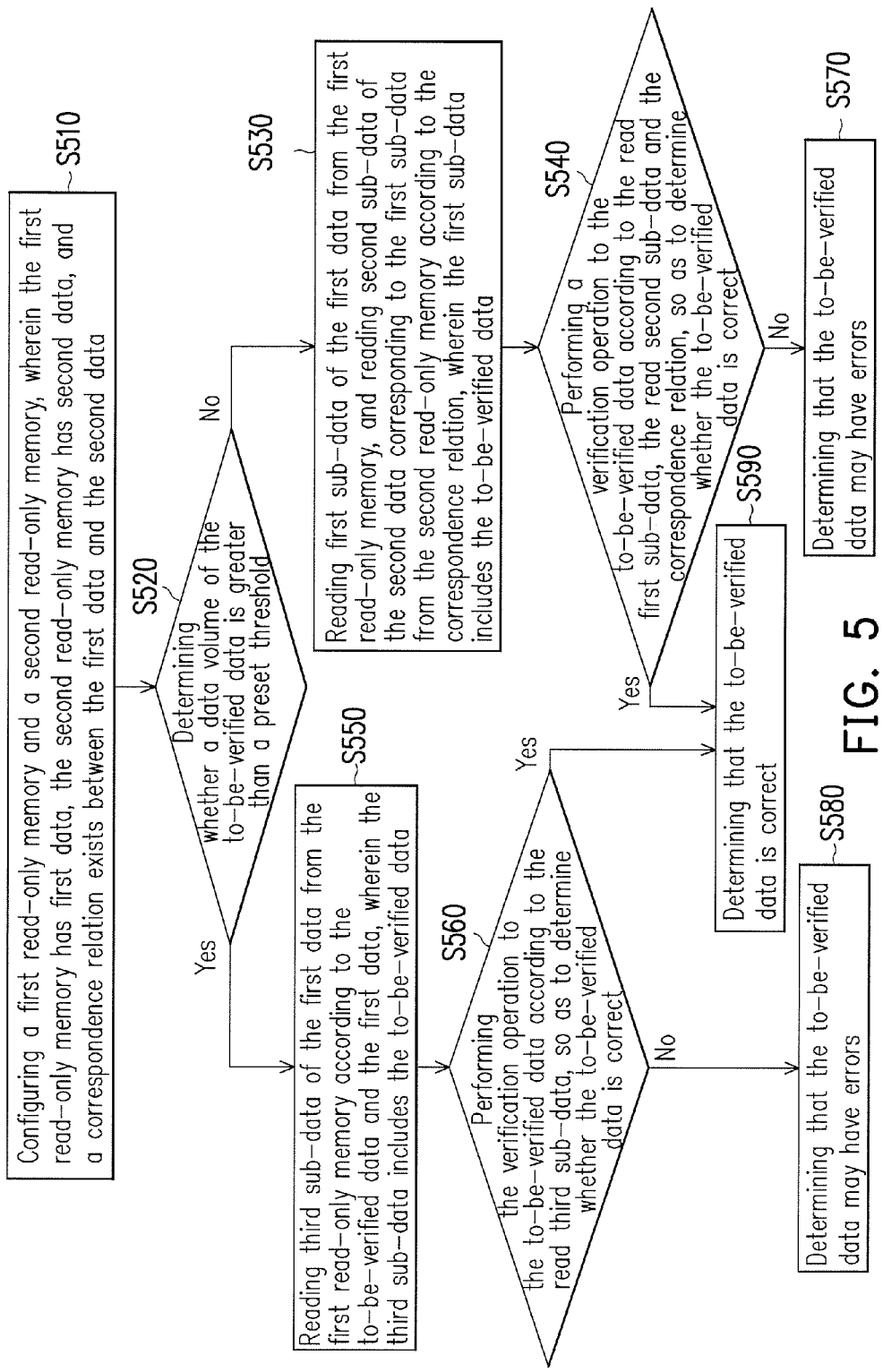
FIG. 5 is a flowchart illustrating a data verification method according to an embodiment of the invention.

FIG. 4 is a schematic diagram illustrating a data verification method according to an embodiment of the invention. FIG. 5 is a flowchart illustrating a data verification method according to an embodiment of the invention. The method of the present embodiment is adapted to the electronic apparatus 100 of FIG. 1. Detailed steps in the method of the present embodiment are described below with reference to each component of the electronic apparatus 100 in FIG. 1.

Referring to FIG. 4 and FIG. 5, step S510 in the present embodiment is identical to step S310 in the embodiment of FIG. 3. In other words, first data and second data in the first read-only memory 110 and the second read-only memory 130 in FIG. 4 are identical to the first data and the second data in FIG. 2, respectively. In the present embodiment, for example, the controller 150 receives a read command which instructs the controller 150 to read to-be-verified data B1c to B1(c+m−1) including m byte from the first read-only memory 110, and the to-be-verified data B1c to B1(c+m−1) are, for example, grouped into the same data group DGx. In step S520, the controller 150 determines whether a data volume of the to-be-verified data is greater than a preset threshold. In the present embodiment, the data group DGx where the to-be-verified data B1c to B1(c+m−1) are located includes, for example, $n_x$ bytes. Therefore, if the checksum byte in this data group DGx is used to verify the to-be-verified data B1c to B1(c+m−1), a total of $n_x$ bytes must be read; otherwise, if the data verification method provided by the embodiment of FIG. 2 is used to perform the verification operation for each byte in the to-be-verified data B1c to B1(c+m−1), a total of 2m bytes must be read. Accordingly, in the present embodiment, the preset threshold is set as $n_x/2$. More specifically, if $n_x>2m$, the purpose of verifying data by using fewer read count may be accomplished by using the data verification method provided by the embodiment of FIG. 2 for each byte in the to-be-verified data.

In the present embodiment, if the controller 150 determines that m is not greater than $n_x/2$ in step S520, the controller 150 may verify each byte of the to-be-verified data B1c to B1(c+m−1) by using the data verification method of the embodiment of FIG. 2 for each of the to-be-verified data B1c to B1(c+m−1) in step S530 and step S540. If the controller 150 determines that the to-be-verified data is correct according to the result of the verification operation, the method proceeds to step S590; otherwise, the method proceeds to step S570. Particularly, in an embodiment of the invention, if it is determined that the to-be-verified data B1c to B1(c+m−1) may have errors in step S570, the controller 150 does not use such to-be-verified data in response to the read command but restores the to-be-verified data according to the result of the verification operation. In the present embodiment, implementation of the steps S530, S540, S570 and S590 is similar to performing steps S320, S330, S350 and S340 in the embodiment of FIG. 3 for each byte in the to-be-verified data, and thus related descriptions are not repeated hereinafter.

In the present embodiment, if the controller 150 determines that m is greater than $n_x/2$, the method proceeds to step S550. In step S550, the controller 150 reads third sub-data of the first data from the first read-only memory 110 according to the to-be-verified data and the first data. In the present embodiment, the controller 150 reads all $n_x$ bytes in the data group DGx where the to-be-verified data B1c to B1(c+m−1) are located as the third sub-data. Next, in step S560, the controller 150 performs the verification operation to the to-be-verified data according to the read third sub-data, so as to determine whether the to-be-verified data are correct. In the present embodiment, the controller 150 may perform the XOR operation to each byte in the third sub-data, for example. Since the third sub-data includes the predefined checksum byte, if the result of the XOR operation is zero byte, the controller 150 may then determine that the to-be-verified data B1c to B1(c+m−1) are correct in step S590, so that the to-be-verified data B1c to B1(c+m−1) determined as being correct may be used in response to the read command. Conversely, if the result of the XOR operation is not zero byte, the controller 150 determines that the to-be-verified data B1c to B1(c+m−1) may have errors in step S580, so that the to-be-verified data B1c to B1(c+m−1) is not used in response to the read command.

The data verification method may be dynamically adjusted by further determining whether the data volume of the to-be-verified data is greater than the preset threshold in the method of the foregoing embodiment. Also, the preset threshold relates to the first data and the correspondence relation between the first data and the second data. By dynamically adjusting the data verification method, it can be further ensured that the electronic apparatus provided by the invention is able to perform the data verification method by using fewer read count to improve the data verification efficiency.

It is worth mentioning that, in the foregoing embodiment, the to-be-verified data B1c to B1(c+m−1) are in the same data group, but the invention is not limited thereto. In other embodiments, the to-be-verified data B1c to B1(c+m−1) may also be distributed across different groups.

Further, in the foregoing embodiment, the second data serves as the backup of the first data in mirror manner. In other words, content of the second data is identical to that of the first data. However, the invention is not limited thereto. In other embodiments, the content of the second data may also be configured to be different from that of the first data, for example. This will be discussed with reference to the following embodiment.

Figure 6:
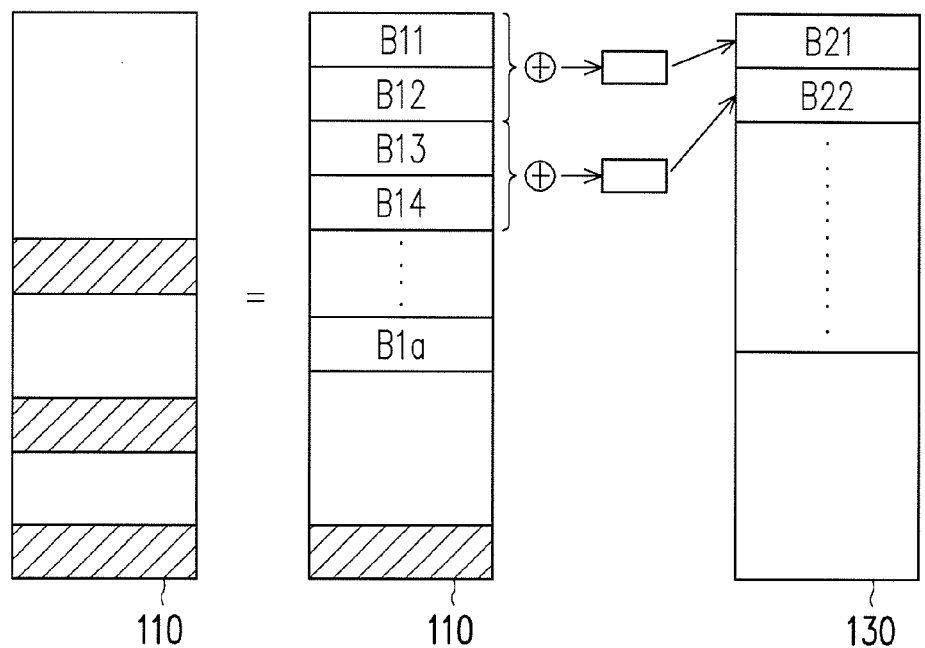
FIG. 6 is a schematic diagram illustrating a data verification method according to an embodiment of the invention.

FIG. 6 is a schematic diagram illustrating a data verification method according to an embodiment of the invention. The method of the present embodiment is also adapted to the electronic apparatus 100 of FIG. 1 and steps of the flow in FIG. 3. Detailed steps in the method of the present embodiment are described below with reference to each component of the electronic apparatus 100 in FIG. 1 and steps in the flow of FIG. 3.

Referring to FIG. 3 and FIG. 6, in step S310, the controller 150 configures the first read-only memory 110 having first data and the second read-only memory 130 having second data, wherein a correspondence relation exists between the first data and the second data. As shown in FIG. 6, first data in the first read-only memory 110 is similar to the first data in the first read-only memory 110 in the embodiment of FIG. 2, which is not repeated hereinafter. The second read-only memory 130 includes second data having a correspondence relation with the first data. In the present embodiment, a configuration method of the second data includes, for example, sequentially performing a specific operation to each of the bytes B11 to B1n of the first data in pairwise and non-repeating manner, and sequentially recording results of the specific operation as the second data into the second read-only memory 130. For instance, as shown in FIG. 6, B21=B11⊕B12; B22=B13⊕B14; and the rest may be deduced by analogy. Herein, ⊕ denotes an operator of the specific operation. In the present embodiment, the specific operation ⊕ is, for example, the XOR operation. In other words, the byte B21 is corresponding to the bytes B11 and B12; and the byte B22 is corresponding to the bytes B13 and B14; and the rest may be deduced by analogy.

Then, it is assumed that to-be-verified data is included in the first data. Accordingly, in step S320, the controller 150 reads first sub-data including the to-be-verified data of the first data from the first read-only memory 110, and reads second sub-data of the second data corresponding to the first sub-data from the second read-only memory 130 according to the correspondence relation between the first data and the second data. Specifically, in the present embodiment, the controller 150 may receive, for example, a read command from a host system, and the read command is used to instruct reading, for example, to-be-verified data B1$a$ of one byte from the first read-only memory 110, but the invention is not limited thereto. After the read command is received, the controller 150 reads the first sub-data including the to-be-verified data B1$a$ of the first data from the first read-only memory 110. In the present embodiment, if $a$ is an odd number, the to-be-verified data B1$a$ and a byte B1($a$+1) is corresponding to a byte B2(($a$+1)/2) in the second data. Accordingly, the controller 150 reads the to-be-verified data B1$a$ and a byte B1($a$+1) as the first sub-data from the first read-only memory 110, and reads the byte B2(($a$+1)/2) as the second sub-data from the second read-only memory 130. On the other hand, if $a$ is an non-zero even number, the to-be-verified data B1$a$ and the first data B1($a$−1) is corresponding to a byte B2($a$/2) in the second data. Accordingly, the controller 150 reads the to-be-verified data B1$a$ and the first data B1($a$−1) as the first sub-data from the first read-only memory 110, and reads the byte B2($a$/2) as the second sub-data from the second read-only memory 130.

Next, in step S330, the controller 150 performs a verification operation to the to-be-verified data according to the read first sub-data, the read second sub-data and the correspondence relation between the first data and the second data, so as to determine whether the to-be-verified data is correct. In the present embodiment, the specific operation ⊕ is, for example, the XOR operation. Accordingly, the controller 150 may perform the verification operation to the to-be-verified data by, for example, performing the XOR operation to the first sub-data and the second sub-data again. If the result of the XOR operation is zero byte, in step S340, the controller 150 may determine that the to-be-verified data B1$a$ is correct, so that the to-be-verified data B1$a$ determined as being correct may be used in response to the read command. Conversely, if the result of the XOR operation is not zero byte, in step S350, the controller 150 may determine that the bits of the to-be-verified data B1$a$ may have errors, so that the to-be-verified data B1$a$ possibly having errors is not used in response to the read command. For instance, if bit values of the first bit and the third bit in the result of the XOR operation are 1 while other bit values being 0, the controller 150 determines that the first bit and the third bit of the to-be-verified data B1a may have errors.

Similarly, in other embodiments, the to-be-verified data may also be data including m bytes in stead of data including only one byte.

Figure 7:
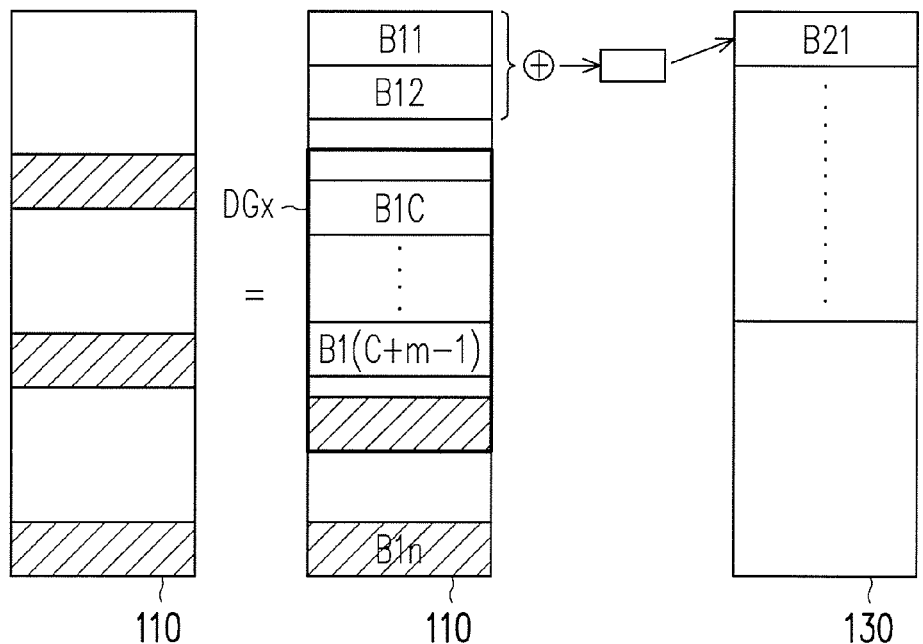
FIG. 7 is a schematic diagram illustrating a data verification method according to an embodiment of the invention.

FIG. 7 is a schematic diagram illustrating a data verification method according to an embodiment of the invention. The method of the present embodiment is also adapted to the electronic apparatus 100 of FIG. 1 and steps in the flow of FIG. 5. Detailed steps in the method of the present embodiment are described below with reference to each component of the electronic apparatus 100 in FIG. 1 and steps in the flow of FIG. 5.

Referring to FIG. 5 and FIG. 7, a configuration method of the first read-only memory 110 and the second read-only memory 130 in FIG. 7 is identical to the configuration method in the embodiment of FIG. 6. In other words, in the present embodiment, implementation of step S510 is similar to step S310 in the embodiment of FIG. 6, which is not repeated hereinafter. In the present embodiment, for example, the controller 150 receives a read command which instructs the controller 150 to read to-be-verified data B1$c$ to B1($c$+m−1) including m byte from the first read-only memory 110, where the to-be-verified data B1$c$ to B1($c$+m−1) are grouped into the same data group DGx. In step S520, the controller 150 determines whether a data volume of the to-be-verified data is greater than a preset threshold. In the present embodiment, the data group DGx where the to-be-verified data B1$c$ to B1($c$+m−1) are located includes, for example, $n_x$ bytes. Therefore, if a checksum bytes in this data group DGx is used to verify the to-be-verified data B1$c$ to B1($c$+m−1), a total of $n_x$ bytes must be read; otherwise, if the data verification method provided by the embodiment of FIG. 6 is used to perform the verification operation for each byte in the to-be-verified data B1$c$ to B1($c$+m−1), a total of 3 m bytes must be read. Accordingly, in the present embodiment, the preset threshold is set as $n_x/3$. More specifically, if $n_x$>3 m, the purpose of verifying data by using fewer read count may be accomplished by using the data verification method provided by the embodiment of FIG. 6 for each byte in the to-be-verified data.

In the present embodiment, if the controller 150 determines that m is not greater than $n_x/3$ in step S520, the controller 150 may verify each byte of the to-be-verified data B1$c$ to B1($c$+m−1) by using the data verification method of the embodiment of FIG. 6 for each of the to-be-verified data B1$c$ to B1($c$+m−1) in step S530 and step S540. If the controller 150 determines that the to-be-verified data is correct according to the result of the verification operation, the method proceeds to step S590; otherwise, the method proceeds to step S570. Particularly, in an embodiment of the invention, if it is determined that the to-be-verified data B1$c$ to B1($c$+m−1) may have errors in step S570, the controller 150 does not use such to-be-verified data in response to the read command. Implementation of the steps S530, S540, S570 and S590 is similar to performing steps S320, S330, S350 and S340 in the embodiment of FIG. 6 for each byte in the to-be-verified data, and thus related descriptions are not repeated hereinafter.

In the present embodiment, if the controller 150 determines that m is greater than $n_x/3$ in step S520, the method proceeds to step S550. In the present embodiment, implementation of step S550 is similar to step S550 in the embodiment of FIG. 4, which is not repeated hereinafter.

When the data verification method of the invention is implemented by the method of the foregoing embodiment, a space usage of the second read-only memory 130 may also be effectively saved in addition to reducing the read count required during the verification to improve the data verification efficiency. Specifically, when the first read-only memory 110 and the second read-only memory 130 are configured by using the method of the embodiments of FIG. 6 and FIG. 7, one half the space usage of the second read-only memory 130 may be saved as compared to the embodiments of FIG. 2 and FIG. 4.

Figure 8:
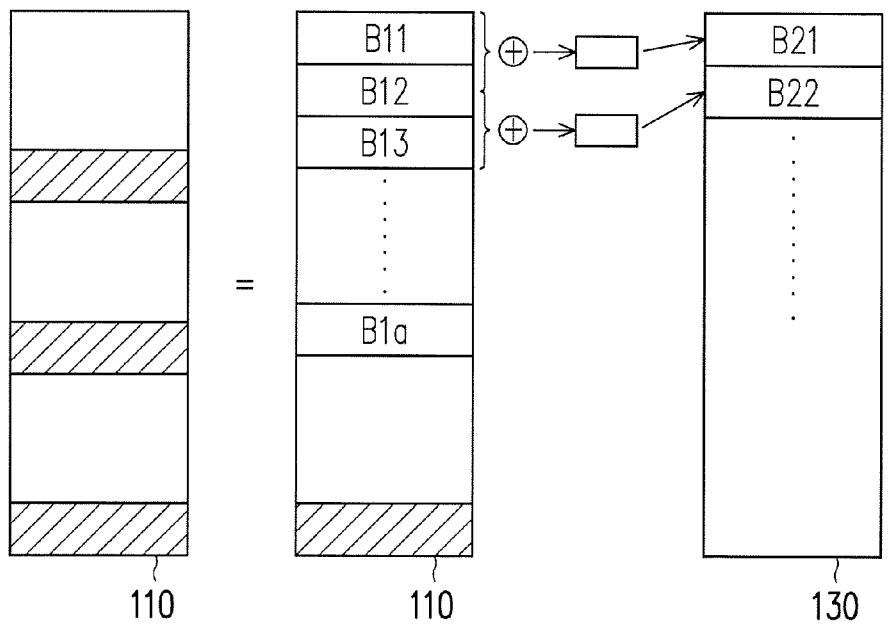
FIG. 8 is a schematic diagram illustrating a data verification method according to an embodiment of the invention.

FIG. 8 is a schematic diagram illustrating a data verification method according to an embodiment of the invention. The method of the present embodiment is also adapted to the electronic apparatus 100 of FIG. 1 and steps in the flow of FIG. 3. Detailed steps in the method of the present embodiment are described below with reference to each component of the electronic apparatus 100 in FIG. 1 and steps in the flow of FIG. 3.

Referring to FIG. 3 and FIG. 8, in step S310, the controller 150 configures the first read-only memory 110 having first data and the second read-only memory 130 having second data, wherein a correspondence relation exists between the first data and the second data. As shown in FIG. 8, first data in the first read-only memory 110 is similar to the first data in the first read-only memory 110 in the embodiment of FIG. 2, which is not repeated hereinafter. The second read-only memory 130 includes second data having a correspondence relation with the first data. In the present embodiment, as shown in FIG. 8, a configuration method of the second data includes, for example, sequentially performing a specific operation to each of the bytes B11 to B1n of the first data in pairwise manner, and sequentially recording results of the specific operation as the second data into the second read-only memory 130. For instance, as shown in FIG. 8, B21=B11⊕B12; B22=B12⊕B13; and the rest may be deduced by analogy. Herein, ⊕ denotes an operator of the specific operation. In the present embodiment, the specific operation ⊕ is, for example, the XOR operation. In other words, the byte B21 is corresponding to the bytes B11 and B12; and the byte B22 is corresponding to the bytes B12 and B13; and the rest may be deduced by analogy.

Then, it is assumed that to-be-verified data is included in the first data. Accordingly, in step S320, the controller 150 reads first sub-data including the to-be-verified data of the first data from the first read-only memory 110, and reads second sub-data of the second data corresponding to the first sub-data from the second read-only memory 130 according to the correspondence relation between the first data and the second data. Specifically, in the present embodiment, the controller 150 may receive, for example, a read command from a host system, and the read command is used to instruct reading, for example, to-be-verified data B1a of one byte from the first read-only memory 110, but the invention is not limited thereto. After the read command is received, the controller 150 reads the first sub-data including the to-be-verified data B1a of the first data from the first read-only memory 110. In the present embodiment, for example, the controller 150 may read the to-be-verified data B1a and the byte B1(a+1) as the first sub-data from the first read-only memory 110, and read the byte B2(a) as the second sub-data from the second read-only memory 130. In another embodiment, for example, the controller 150 may also read the to-be-verified data B1a and the byte B1(a−1) as the first sub-data from the first read-only memory 110, and read the byte B2(a−1) as the second sub-data from the second read-only memory 130, but the invention is not limited to the above.

Next, in step S330, the controller 150 performs a verification operation to the to-be-verified data according to the read first sub-data, the read second sub-data and the correspondence relation between the first data and the second data, so as to determine whether the to-be-verified data is correct. In the present embodiment, the specific operation ⊕ is, for example, the XOR operation. Accordingly, the controller 150 may perform the verification operation to the to-be-verified data by, for example, performing the XOR operation to the first sub-data and the second sub-data again. If the result of the XOR operation is zero byte, in step S340, the controller 150 may determine that the to-be-verified data B1a is correct, so that the to-be-verified data B1a determined as being correct may be used in response to the read command. Conversely, if the result of the XOR operation is not zero byte, in step S350, the controller 150 may determine that the bits of the to-be-verified data B1a may have errors, so that the to-be-verified data B1a possibly having errors is not used in response to the read command. For instance, if bit values of the first bit and the third bit in the result of the XOR operation are 1 while other bit values being 0, the controller 150 determines that the first bit and the third bit of the to-be-verified data B1a may have errors.

Similarly, in other embodiments, the to-be-verified data may also be data including m bytes in stead of data including only one byte.

Figure 9:
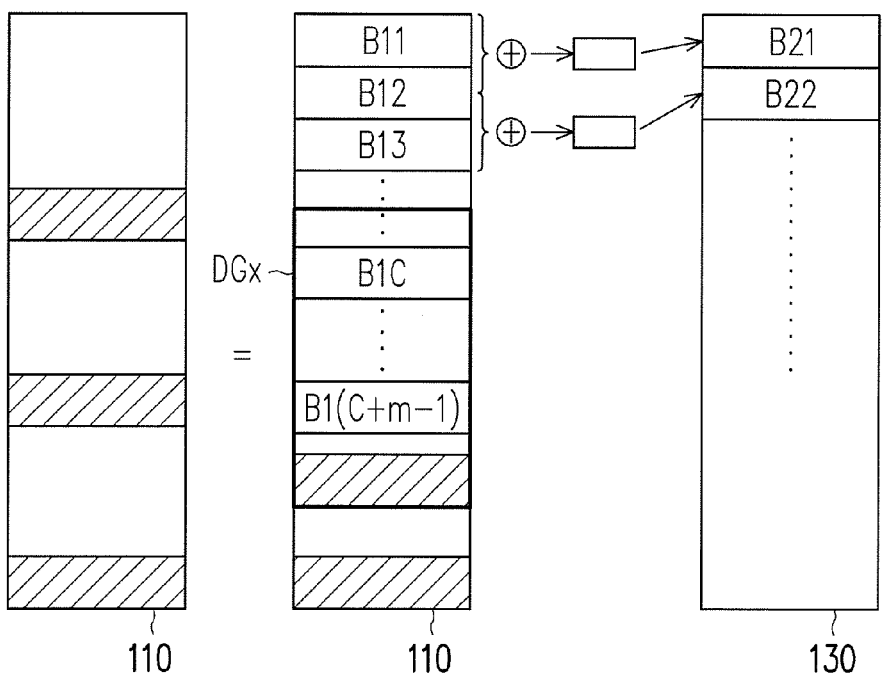
FIG. 9 is a schematic diagram illustrating a data verification method according to an embodiment of the invention.

FIG. 9 is a schematic diagram illustrating a data verification method according to an embodiment of the invention. The method of the present embodiment is also adapted to the electronic apparatus 100 of FIG. 1 and steps in the flow of FIG. 5. Detailed steps in the method of the present embodiment are described below with reference to each component of the electronic apparatus 100 in FIG. 1 and steps in the flow of FIG. 5.

Referring to FIG. 5 and FIG. 9, a configuration method of the first read-only memory 110 and the second read-only memory 130 in FIG. 9 is identical to the configuration method in the embodiment of FIG. 8. In other words, in the present embodiment, implementation of step S510 is similar to step S310 in the embodiment of FIG. 8, which is not repeated hereinafter. In the present embodiment, for example, the controller 150 receives a read command which instructs the controller 150 to read to-be-verified data B1c to B1(c+m−1) including m byte from the first read-only memory 110, where the to-be-verified data B1c to B1(c+m−1) are grouped into the same data group DGx. In step S520, the controller 150 determines whether a data volume of the to-be-verified data is greater than a preset threshold. In the present embodiment, the data group DGx where the to-be-verified data B1c to B1(c+m−1) are located includes, for example, $n_x$ bytes. Therefore, if a checksum bytes in this data group DGx is used to verify the to-be-verified data B1c to B1(c+m−1), a total of $n_x$ bytes must be read; otherwise, if the data verification method provided by the embodiment of FIG. 8 is used to perform the verification operation for each byte in the to-be-verified data B1c to B1(c+m−1), a total of 3 m bytes must be read. Accordingly, in the present embodiment, the preset threshold is set as $n_x/3$. More specifically, if $n_x>3$ m, the purpose of verifying data by using fewer read count may be accomplished by using the data verification method provided by the embodiment of FIG. 8 for each byte in the to-be-verified data.

In the present embodiment, if the controller 150 determines that m is not greater than $n_x/3$ in step S520, the controller 150 may verify each byte of the to-be-verified data B1c to B1(c+m−1) by using the data verification method of the embodiment of FIG. 8 for each of the to-be-verified data B1c to B1(c+m−1) in step S530 and step S540. If the controller 150 determines that the to-be-verified data is correct according to the result of the verification operation, the method proceeds to step S590; otherwise, the method proceeds to step S570. Particularly, in an embodiment of the invention, if it is determined that the to-be-verified data B1c to B1(c+m−1) may have errors in step S570, the controller 150 does not use such to-be-verified data in response to the read command but restores the to-be-verified data according to the result of the verification operation. Implementation of the steps S530, S540, S570 and S590 is similar to performing steps S320, S330, S350 and S340 in the embodiment of FIG. 8 for each byte in the to-be-verified data, and thus related descriptions are not repeated hereinafter.

In the present embodiment, if the controller 150 determines that m is greater than $n_x/3$ in step S520, the method proceeds to step S550. In the present embodiment, implementation of step S550 is also similar to step S550 in the embodiment of FIG. 4, which is not repeated hereinafter.

It is worth mentioning that, by using the data verification method provided by the embodiments of the invention, the controller 150 may further restore the to-be-verified data according to the result of the verification operation after determining that the to-be-verified data may have errors. For example, for the embodiment of FIG. 8, if it is determined that the to-be-verified data B1a may have errors in step S330, the controller 150 may use the similar data verification method to verify the bytes B1(a−1) and B1(a+1) adjacent to the to-be-verified data B1a. When it is determined that the bytes B1(a−1) and B1(a+1) are correct, the controller 150 may, for example, perform the XOR operation to the bytes B1(a−1) and B2a, restore the to-be-verified data B1a back to B1a', and use the restored to-be-verified data B1a' in response to the read command.

In summary, the second read-only memory is configured in the electronic apparatus in addition to the first read-only memory according to the embodiments of the invention, and the correspondence relation exists between the second data of the second read-only memory and the first data of the first read-only memory. As such, while verifying the to-be-verified data in the first read-only memory, the to-be-verified data may be verified by using the first read-only memory, the second read-only memory and said correspondence relation at the same time. Accordingly, the number of times for the read operation is performed during the data verification may be reduced to improve the data verification efficiency. In addition, the correspondence relation between the first data and the second data in the embodiments of the invention prevents the data volume of the second data from being greater than the data volume of the first data, such that the purpose of improving the data verification efficiency may also be accomplished without occupying considerable space usage of the second read-only memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic apparatus, comprising:
a first read-only memory having first data;
a second read-only memory having second data, wherein a correspondence relation exists between the first data and the second data; and
a controller, coupled to the first read-only memory and the second read-only memory,
wherein the controller reads first sub-data of the first data from the first read-only memory, and reads second sub-data of the second data corresponding to the first sub-data from the second read-only memory according to the correspondence relation, wherein the first sub-data comprises to-be-verified data, and the controller performs a verification operation to the to-be-verified data according to the first sub-data, the second sub-data and the correspondence relation.

2. The electronic apparatus of claim 1, wherein the controller determines whether a data volume of the to-be-verified data is greater than a preset threshold, and
the controller reads third sub-data of the first data from the first read-only memory according to the to-be-verified data when the data volume of the to-be-verified data is greater than the preset threshold, wherein the third sub-data comprises the to-be-verified data, and
the controller performs the verification operation to the to-be-verified data according to the third sub-data.

3. The electronic apparatus of claim 2, wherein the controller calculates the preset threshold according to the first data and the correspondence relation.

4. The electronic apparatus of claim 1, wherein the second data is a backup of the first data.

5. The electronic apparatus of claim 1, wherein a data volume of the second data is not greater than a data volume of the first data.

6. The electronic apparatus of claim 1, wherein the first read-only memory and the second read-only memory belong to an electrically erasable programmable ROM.

7. The electronic apparatus of claim 1, wherein the electronic apparatus is compliant with a Storage Bridge Bay standard.

8. A data verification method, adapted to verify to-be-verified data, and comprising:
configuring a first read-only memory and a second read-only memory, wherein the first read-only memory has first data, the second read-only memory has second data, and a correspondence relation exists between the first data and the second data;
reading first sub-data of the first data from the first read-only memory, and reading second sub-data of the second data corresponding to the first sub-data from the second read-only memory according to the correspondence relation, wherein the first sub-data comprises the to-be-verified data; and
performing a verification operation to the to-be-verified data according to the first sub-data, the second sub-data and the correspondence relation.

9. The data verification method of claim 8, further comprising:
determining whether a data volume of the to-be-verified data is greater than a preset threshold; and
reading third sub-data of the first data from the first read-only memory according to the to-be-verified data when the data volume of the to-be-verified data is greater than the preset threshold, wherein the third sub-data comprises the to-be-verified data; and
performing the verification operation to the to-be-verified data according to the third sub-data.

10. The data verification method of claim 9, wherein the preset threshold relates to the first data and the correspondence relation.

11. The data verification method of claim 8, wherein the second data is a backup of the first data.

12. The data verification method of claim 8, wherein a data volume of the second data is not greater than a data volume of the first data.

13. The data verification method of claim 8, wherein the first read-only memory and the second read-only memory belong to an electrically erasable programmable ROM.

* * * * *